United States Patent
Kato

(10) Patent No.: US 9,801,320 B2
(45) Date of Patent: Oct. 24, 2017

(54) DEVICE FOR JUDGING WHETHER SPLICING OF CARRIER TAPES IS ALLOWED

(71) Applicant: FUJI MACHINE MFG. CO., LTD., Chiryu (JP)

(72) Inventor: Daisuke Kato, Kuwana (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 0 days.

(21) Appl. No.: 15/034,018

(22) PCT Filed: Nov. 26, 2013

(86) PCT No.: PCT/JP2013/081751
§ 371 (c)(1),
(2) Date: May 3, 2016

(87) PCT Pub. No.: WO2015/079488
PCT Pub. Date: Jun. 4, 2015

(65) Prior Publication Data
US 2016/0278252 A1    Sep. 22, 2016

(51) Int. Cl.
H05K 13/02    (2006.01)
H05K 13/08    (2006.01)
H05K 13/04    (2006.01)

(52) U.S. Cl.
CPC ........... *H05K 13/08* (2013.01); *H05K 13/021* (2013.01); *H05K 13/0417* (2013.01)

(58) Field of Classification Search
CPC .. B65H 2301/46011; B65H 2301/4602; H05K 13/0417; H05K 13/08; H05K 13/02; H05K 13/021

USPC ......................... 156/361, 367, 368
See application file for complete search history.

(56) References Cited

FOREIGN PATENT DOCUMENTS

| JP | 06-100217 A | | 4/1994 |
| JP | 2008078235 A | * | 4/2008 |
| JP | 2009182160 A | * | 8/2009 |

(Continued)

OTHER PUBLICATIONS

Translation of JP 2012104635 A, May 2012, Kobayashi, Hitoshi.*

(Continued)

*Primary Examiner* — George Koch
(74) *Attorney, Agent, or Firm* — Oblon, McClelland, Maier & Neustadt, L.L.P.

(57) ABSTRACT

The present application discloses a device for judging whether splicing of carrier tapes, which house multiple electronic components at a specified interval, wound around different reels is allowed. The device is provided with a data management section and a judging section. In the device, the data management section creates an association between and memorizes the reel ID, the type of electronic components housed in the carrier tape wound around the reel, the remaining quantity of electronic components housed in the carrier tape wound around the reel, and the possible winding quantity of electronic components to the reel. Also, in the device, the judging section, in a case in which the total of the remaining quantities of electronic components of two reels exceeds the possible winding quantity of the reel to be wound onto, judges that splicing of the carrier tapes is not allowed.

5 Claims, 2 Drawing Sheets

(56) References Cited

FOREIGN PATENT DOCUMENTS

JP        2012104635  A  *  5/2012

OTHER PUBLICATIONS

Translation of JP 2009182160 A, Aug. 2009, Ito, Saburo.*
Translation of JP 2008078235 A, Apr. 2008, Eguchi, Ryoji.*
International Search Report dated Feb. 4, 2014 for PCT/JP2013/081751 filed on Nov. 26, 2013.

* cited by examiner

DEVICE FOR JUDGING WHETHER SPLICING OF CARRIER TAPES IS ALLOWED

This application is 371 of PCT/JP2013/081751, filed on Nov. 26, 2013.

TECHNICAL FIELD

The present disclosure relates to a device for judging whether splicing of carrier tapes, which house multiple electronic components at a specified interval, wound around different reels is allowed.

BACKGROUND ART

JP-A Heisei 6-100217 discloses a device that splices carrier tapes, which house multiple electronic components at a specified interval, wound around different reels. Using this device, it is possible to newly prepare a single reel with a larger quantity of electronic components by splicing two reels of carrier tapes that have been returned to a warehouse without all the electronic components being used up.

SUMMARY

When splicing carrier tapes, if the carrier tape after splicing becomes extremely long, it will not be possible to wind the carrier tape onto the reel. Thus, conventionally, when splicing carrier tapes, an operator visually checks the amount of carrier tape on each reel and judges whether splicing is allowed. Hence, there is a need for a technique that judges whether splicing of carrier tapes is allowed without relying on the experience or intuition of the operator.

The present application discloses a device for judging whether splicing of carrier tapes, which house multiple electronic components at a specified interval, wound around different reels is allowed. The device is provided with a data management section and a judging section. In the device, the data management section creates an association between and memorizes the reel ID, the type of electronic components housed in the carrier tape wound around the reel, the remaining quantity of electronic components housed in the carrier tape wound around the reel, and the possible winding quantity of electronic components to the reel. Also, in the device, the judging section, in a case in which the total of the remaining quantities of electronic components of two reels exceeds the possible winding quantity of the reel to be wound onto, judges that splicing of the carrier tapes is not allowed.

In the above device, the judgment as to whether splicing of carrier tapes is allowed is based on the total of the remaining quantities of electronic components housed in the carrier tapes wound around two reels, and the possible winding quantity of electronic components of the reel to be wound onto. With this configuration, it is possible to judge whether splicing of carrier tapes is allowed without relying on the experience or intuition of the operator.

DESCRIPTION OF EMBODIMENTS

According to an embodiment of the device, the judging section, in a case in which splicing of carrier tapes is possible whichever of the two reels is the reel to be wound onto, may indicate that the reel with the larger remaining quantity of electronic components is the reel to be wound onto. When splicing carrier tapes, carrier tape must be completely unwound from the reel which is not the reel to be wound onto, and then, all of the spliced carrier tape needs to be wound onto the reel which is to be wound onto. Work required when splicing carrier tapes is reduced by making the reel with the larger remaining quantity of electronic components the reel to be wound onto.

According to an embodiment of the device, the judging section first judges whether splicing of carrier tapes is allowed with the reel with the larger remaining quantity of electronic components out of the two reels as the reel to be wound onto, and, in a case in which splicing of carrier tapes is not allowed, the judging section judges whether splicing of carrier tapes is allowed with the reel with the smaller remaining quantity of electronic components as the reel to be wound onto. According to the device, the reel with the larger remaining quantity of electronic components is given priority when deciding the reel to be wound onto. This reduces the work required when splicing carrier tapes.

Embodiments

Figure 1:
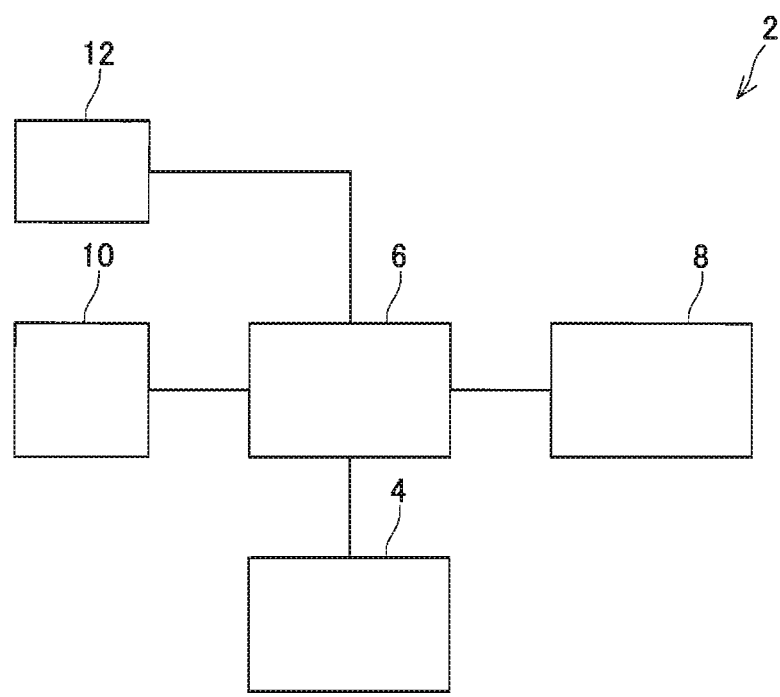
FIG. 1 is a block diagram schematically showing the configuration of splicing judging device 2 of an embodiment of the disclosure.

Embodiments are described below with reference to the attached drawings. According to an embodiment of the disclosure, splicing judging device 2 judges whether splicing of carrier tapes wound around different reels is allowed. Carrier tape housing multiple electronic components at a specified interval is wound around each reel. Each reel is, for example, attached to a tape feeder and used for supplying electronic components to an SMT mounter. It is possible to newly prepare a single reel with a larger quantity of electronic components by splicing two reels of carrier tapes that have been returned to a warehouse without all the electronic components being used up. As shown in FIG. 1, splicing judging device 2 is provided with data management section 4, judging section 6, reel identification section 8, reporting section 10, and entry section 12.

An identification code such as a barcode by which the reel ID can be identified is attached to each reel. Splicing judging device 2 acquires the reel ID of a reel by reading the reel identification code using reel identification section 8.

Data management section 4 creates an association between and memorizes the reel ID, the type of electronic components housed in the carrier tape wound around the reel, the remaining quantity of electronic components housed in the carrier tape wound around the reel, and the possible winding quantity of electronic components to the reel.

Judging section 6 performs the processing shown in FIG. 6 (described in detail later) to judge whether splicing of the carrier tapes wound around the two reels is allowed.

Reporting section 10 reports the judgment result of judging section 6 to an operator. Reporting section 10 may be, for example, a display that indicates the judgment result to the operator using characters or pictures, or may be a speaker that indicates the judgment result to the operator using sounds.

Entry section 12 receives entries from an operator as to whether splicing work has been performed. Entry section 12 may be, for example, a touch screen, keyboard, button, or switch.

Processing performed by judging section 6 is described below with reference to FIG. 2.

In step S2, judging section 6 acquires the reel ID of one of the reels (also referred to as reel A) from reel identification section 8.

In step S4, judging section 6, based on the reel ID of reel A, acquires the type of electronic components housed in the carrier tape on reel A, the remaining quantity of electronic components housed in carrier tape of reel A, and the possible winding quantity of electronic components to reel A, from data management section 4.

In step S6, judging section 6 acquires the reel ID of the other reel (also referred to as reel B) from reel identification section 8.

In step S8, judging section 6, based on the reel ID of reel B, acquires the type of electronic components housed in the carrier tape on reel B, the remaining quantity of electronic components housed in carrier tape of reel B, and the possible winding quantity of electronic components to reel B, from data management section 4.

In step S10, judging section 6 judges whether the type of electronic components in reel A and the type of electronic components in reel B are the same. In a case in which the type of electronic components in reel A and the type of electronic components in reel B are not the same (step S10 is NO), processing continues to step S12. In step S12, judging section 6 reports the fact that splicing of carrier tapes is not allowed because the types of electronic components in reel A and reel B do not match to an operator via reporting section 10. After step S12, processing in FIG. 2 ends.

In a case in which the type of electronic components in reel A and the type of electronic components in reel B are the same in step S10 (YES), processing continues to step S14. In step S14, judging section 6 sets as the reel to be wound onto the reel from reel A and reel B which has the larger remaining quantity of electronic components.

In step S16, judging section 6 judges whether the total of the remaining quantities of electronic components of reel A and reel B is equal to or less than the possible winding quantity of the reel to be wound onto. In a case in which the total of the remaining quantities of electronic components of reel A and reel B is equal to or less than the possible winding quantity of the reel to be wound onto (step S16 is YES), processing continues to step S24. In a case in which the total of the remaining quantities of electronic components of reel A and reel B exceeds the possible winding quantity of the reel to be wound onto (step S16 is NO), judging section 6 judges that splicing of carrier tapes is not allowed if the reel with the larger remaining quantity of electronic components is made the reel to be wound onto. In this case, processing proceeds to step S18.

In step S18, judging section 6 sets as the reel to be wound onto the reel from reel A and reel B which has the smaller remaining quantity of electronic components.

In step S20, judging section 6 judges whether the total of the remaining quantities of electronic components of reel A and reel B is equal to or less than the possible winding quantity of the reel to be wound onto. In a case in which the total of the remaining quantities of electronic components of reel A and reel B exceeds the possible winding quantity of the reel to be wound onto (step S20 is NO), judging section 6 judges that splicing of carrier tapes is not allowed if the reel with the smaller remaining quantity of electronic components is made the reel to be wound onto. In this case, processing continues to step S22, and judging section 6 reports the fact that splicing of carrier tapes is not allowed because the total of the remaining quantities of electronic components of reel A and reel B exceeds the possible winding quantities of reel A and reel B to an operator via reporting section 10. After step S22, processing in FIG. 2 ends.

In a case in which the total of the remaining quantities of electronic components of reel A and reel B is equal to or less than the possible winding quantity of the reel to be wound onto in step S20 (YES), processing continues to step S24. In step S24, judging section 6 reports the reel set as the reel to be wound onto and the fact that carrier tapes are allowed to be spliced to an operator via reporting section 10.

In step S26, judging section 6 waits until an operator inputs that carrier tape splicing work has been performed via entry section 12.

In step S28, judging section 6 updates the remaining quantities of electronic components in reel A and reel B in data management section 4. Specifically, judging section 6 updates the remaining quantity of electronic components of the reel from reel A and reel B which was used as the reel to be wound onto as the total of the pre-splicing remaining quantities of electronic components of reel A and B, and updates the remaining quantity of electronic components of the reel not used as the reel to be wound onto as zero. After step S28, processing in FIG. 2 ends.

In the embodiment of splicing judging device 2, the judgment as to whether splicing of carrier tapes is allowed is based on the total of the remaining quantities of electronic components housed in the carrier tapes wound around two reels, and the possible winding quantity of electronic components of the reel to be wound onto. With this configuration, it is possible to judge whether splicing of carrier tapes is allowed without relying on the experience or intuition of the operator.

In the embodiment of splicing judging device 2, the judging section, in a case in which splicing of carrier tapes is possible whichever of the two reels is the reel to be wound onto, indicates that the reel with the larger remaining quantity of electronic components is the reel to be wound onto. When splicing carrier tapes, carrier tape must be completely unwound from the reel which is not the reel to be wound onto, and then, all of the spliced carrier tape needs to be wound onto the reel which is to be wound onto. By the embodiment of splicing judging device 2 indicating as described, work required when splicing carrier tapes is reduced by making the reel with the larger remaining quantity of electronic components the reel to be wound onto.

Figure 2:
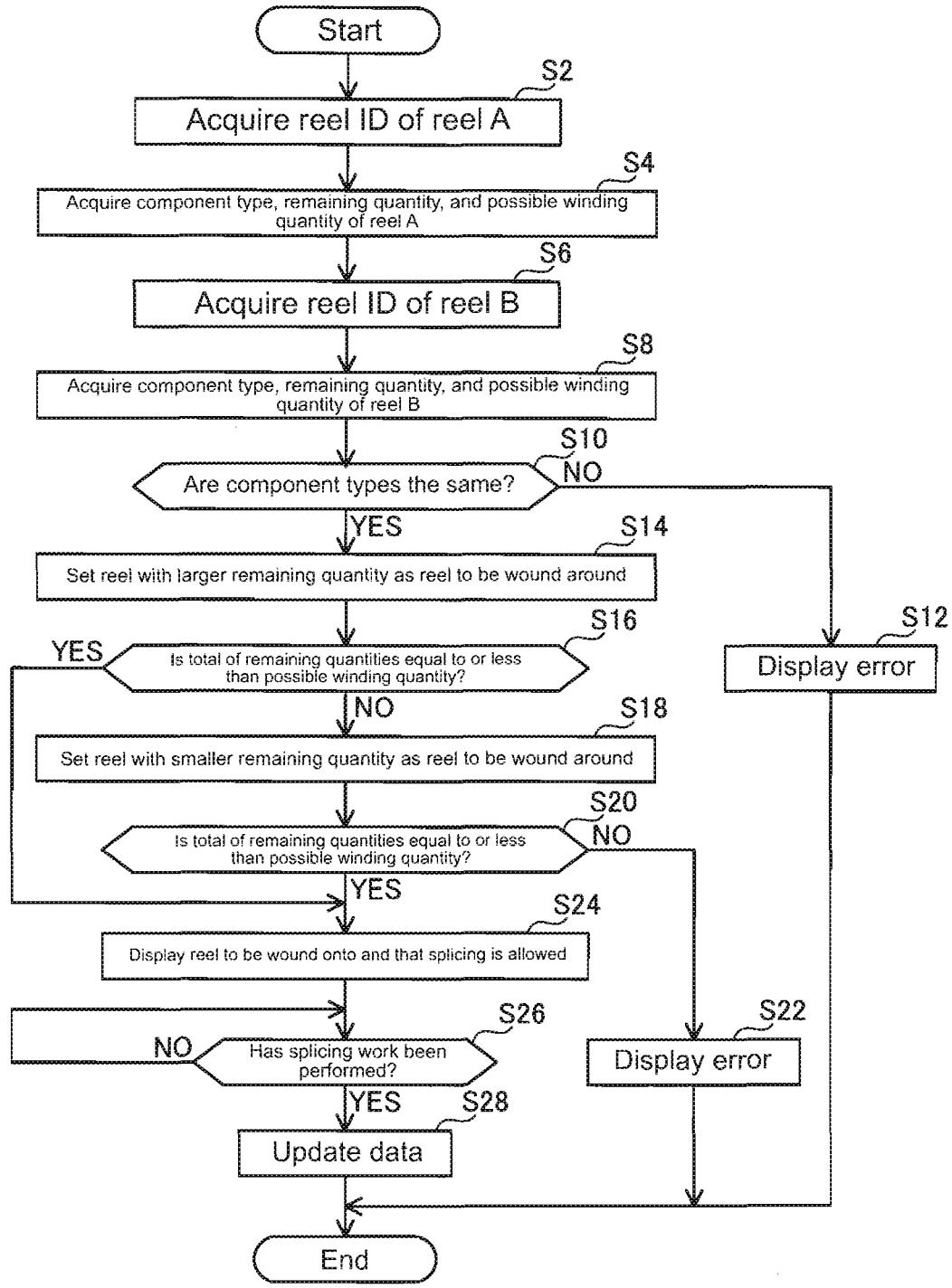
FIG. 2 is a flowchart showing the processing performed by judging section 6 in splicing judging device 2 of an embodiment of the disclosure.

Note that, for processing of the above embodiment shown in FIG. 2, in a case, for example, in which reel A and reel B are substantially of the same form, and the possible winding quantities of reel A and reel B are substantially the same, the processing of step S18 and step S20 may be omitted. In this case, in a case in which the total of the remaining quantities of electronic components of reel A and reel B exceeds the possible winding quantity of the reel to be wound onto in step S16 (NO), processing continues to step S22.

Note that, for processing of the embodiment shown in FIG. 2, in a case in which the total of the remaining quantities of electronic components of reel A and reel B is smaller than a specified quantity (for example, half the possible winding quantity of the reel to be wound onto), judging section 6 may judge that splicing of the carrier tapes is not allowed. With this kind of configuration, it is possible to prevent splicing of carrier tapes of a combination of reel A and reel B that results in a spliced carrier tape with a remaining quantity of electronic components that is too small.

In the above embodiment, judging section 6 may perform judging processing from FIG. 2 for every combination of any two reels among the reels existing in a warehouse, and judging section 6 may indicate a combination of two reels for which splicing of carrier tapes is allowed from reels existing in the warehouse. Alternatively, in the above embodiment, judging section 6, from the combinations of reels in the warehouse, may indicate to an operator the combination of two reels for which the remaining quantity of electronic components in the carrier tape after splicing is close to the possible winding quantity of the reel to be wound onto (for example, between 90% and 100% of the possible winding quantity). Alternatively, for the above embodiment, judging section 6 may indicate to the operator, from the combinations of reels existing in the warehouse, a combination of two reels for which the remaining quantity of electronic components in the spliced carrier tape corresponds to the quantity of electronic components required for planned production (for example, between 100% to 110% of the quantity of electronic components required).

Note that, in the above embodiment, descriptions were given in a case in which data management section 4 is provided separately to the reels, but a portion of or the entire data management section 4 may be integrated with the reel itself. For example, the reels may be provided with memory such as an RF tag, reel identification section 8 may be able to access the memory of the reel, and the reel ID of the reel, the type of electronic components housed in the carrier tape wound around the reel, the remaining quantity of electronic components housed in the carrier tape of the reel, and the possible winding quantity of electronic components to the reel may be memorized in the memory of the reel.

A representative and non-limiting specific example of the present disclosure has been described in detail with reference to the drawings. This detailed description simply illustrates the details for realizing a desirable example of the disclosure for those skilled in the art, and does not limit the range of the present disclosure. In addition, the disclosed additional characteristics can be used separately or together with other characteristics and inventions in order to provide an improved splicing judging device.

In addition, a combination of the characteristics or processes disclosed in the above detailed description is not necessary when realizing the present disclosure in a broadest sense, and in particular, the description is only for describing representative details of an example of the present disclosure. Furthermore, various characteristics of the above representative detailed example, and various characteristics described, are not necessarily combined according to the detailed example described here or the listed order when providing an additional and useful embodiment of the present disclosure.

All of the characteristics described in this specification are characteristics which are disclosed separately and independently from each other. Furthermore, descriptions regarding numeral value ranges and groups or aggregations disclose an intermediate configuration as a restriction with respect to a certain item.

The above describes details of specific examples of the present embodiment, but these are only examples and in no way restrict the disclosure. The techniques disclosed include various changes and modifications to the specific examples illustrated above. Technical elements described in this specification and in the drawings exhibit technical utility alone or in various combinations, and are not limited to the combination of the described aspects of the application. Also, the examples of the techniques in this specification and the figures achieve multiple purposes at the same time, but also exhibit technical utility when achieving one among those purposes.

The invention claimed is:

1. A device that judges whether splicing of carrier tapes, which house multiple electronic components at a specified interval, wound around different reels is allowed, the device comprising:
   a data management section; and
   a judging section,
   wherein the data management section creates an association between and memorizes a reel ID of a first reel and of a second reel, a type of electronic components housed in a carrier tape wound around the first reel and the second reel, a remaining quantity of electronic components housed in the carrier tape wound around the first reel and the second reel, and a maximum possible winding quantity of electronic components to the first reel and to the second reel, and
   wherein the judging section, in a case in which a total of the remaining quantities of electronic components of the first reel and the second reel exceeds the maximum possible winding quantity of the reel to be wound onto selected from the first reel and the second reel, judges that splicing of the carrier tapes is not allowed.

2. The device according to claim 1,
   wherein the judging section indicates that the reel with the larger remaining quantity of electronic components selected from the first reel and the second reel is the reel to be wound onto.

3. The device according to claim 1,
   wherein the judging section first judges whether splicing of carrier tapes is allowed with the reel selected from the first reel and the second reel with the larger remaining quantity of electronic components as the reel to be wound onto, and, in a case in which splicing of carrier tapes is not allowed, the judging section judges whether splicing of carrier tapes is allowed with the reel with the smaller remaining quantity of electronic components as the reel to be wound onto.

4. The device according to claim 1, wherein in the case where the total of the remaining quantities of electronic components of the first reel and the second reel is less than a predetermined amount of the maximum possible winding quantity of the reel to be wound onto, the judging section judges that splicing of the carrier tapes is not allowed.

5. The device according to claim 4, wherein the predetermined amount is less than 90% of the maximum possible winding quantity of the reel to be wound onto.

\* \* \* \* \*